(12) United States Patent
Yamamoto et al.

(10) Patent No.: US 8,598,706 B2
(45) Date of Patent: Dec. 3, 2013

(54) METHOD FOR FORMING INTERLAYER DIELECTRIC FILM, INTERLAYER DIELECTRIC FILM, SEMICONDUCTOR DEVICE AND SEMICONDUCTOR MANUFACTURING APPARATUS

(75) Inventors: Hironori Yamamoto, Tokyo (JP); Fuminori Ito, Tokyo (JP); Yoshihiro Hayashi, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 781 days.

(21) Appl. No.: 12/212,396

(22) Filed: Sep. 17, 2008

(65) Prior Publication Data

US 2009/0127669 A1 May 21, 2009

(30) Foreign Application Priority Data

Sep. 18, 2007 (JP) ................................. 2007-240721

(51) Int. Cl.
*H01L 29/40* (2006.01)

(52) U.S. Cl.
USPC ........... 257/758; 438/220; 438/762; 438/788; 438/770; 438/694; 257/759; 257/760; 257/79; 257/790; 257/410

(58) Field of Classification Search
USPC ........... 257/758–760, 744, 79, 790, 410, 676; 438/220, 762, 788, 770, 694, 781
See application file for complete search history.

(56) References Cited

U.S. PATENT DOCUMENTS

| | | | | |
|---|---|---|---|---|
| 4,599,440 A | * | 7/1986 | Watanabe et al. | 556/460 |
| 5,041,304 A | * | 8/1991 | Kusano et al. | 427/535 |
| 5,223,739 A | * | 6/1993 | Katsumata et al. | 257/676 |
| 5,240,588 A | * | 8/1993 | Uchida | 205/125 |
| 5,629,439 A | * | 5/1997 | Bank et al. | 556/480 |
| 5,780,661 A | * | 7/1998 | Iwata et al. | 556/429 |
| 5,786,493 A | * | 7/1998 | Rauleder et al. | 556/443 |
| 5,914,420 A | * | 6/1999 | Buese et al. | 556/448 |
| 5,962,344 A | * | 10/1999 | Tu et al. | 438/694 |
| 6,068,884 A | * | 5/2000 | Rose et al. | 438/762 |
| 6,153,530 A | * | 11/2000 | Ye et al. | 438/720 |
| 6,160,150 A | * | 12/2000 | Krahnke et al. | 556/451 |
| 6,441,491 B1 | * | 8/2002 | Grill et al. | 257/759 |
| 6,572,923 B2 | * | 6/2003 | Ma et al. | 427/255.27 |
| 6,733,954 B2 | * | 5/2004 | Yamamoto et al. | 430/311 |
| 6,756,323 B2 | * | 6/2004 | Grill et al. | 438/780 |
| 6,759,336 B1 | * | 7/2004 | Chebi et al. | 438/694 |
| 6,787,481 B2 | * | 9/2004 | Asai et al. | 438/785 |

(Continued)

FOREIGN PATENT DOCUMENTS

| | | |
|---|---|---|
| JP | 11-330070 A | 11/1999 |
| JP | 2004-158793 A | 6/2004 |

(Continued)

OTHER PUBLICATIONS

Japan Patent Office Action for Application No. 2007-240721; dated Jan. 20, 2012.

*Primary Examiner* — Fernando L Toledo
*Assistant Examiner* — Mohammed Shamsuzzaman
(74) *Attorney, Agent, or Firm* — Sughrue Mion, PLLC

(57) ABSTRACT

A method for forming an interlayer dielectric film by a plasma CVD method, including turning off a radio frequency power and purging with an inert gas simultaneously.

13 Claims, 7 Drawing Sheets

(a)

(b)

(56) References Cited

U.S. PATENT DOCUMENTS

| | | |
|---|---|---|
| 7,160,625 B2 | 1/2007 | Hara et al. |
| 7,279,398 B2* | 10/2007 | Basceri et al. ............... 438/448 |
| 7,396,563 B2* | 7/2008 | Scarlete et al. ............ 427/248.1 |
| 7,579,286 B2* | 8/2009 | Tabuchi ....................... 438/788 |
| 7,601,402 B2 | 10/2009 | Kashiwagi et al. |
| 7,790,479 B2* | 9/2010 | Favre et al. ..................... 438/14 |
| 7,906,393 B2* | 3/2011 | Zheng et al. ................. 438/255 |
| 7,935,425 B2 | 5/2011 | Hara et al. |
| 7,968,359 B2* | 6/2011 | Hersee .......................... 438/41 |
| 8,110,491 B2* | 2/2012 | Harada ........................ 438/591 |
| 2002/0113241 A1* | 8/2002 | Kubota et al. .................. 257/79 |
| 2002/0132408 A1* | 9/2002 | Ma et al. ...................... 438/200 |
| 2002/0192851 A1* | 12/2002 | Ahn ............................... 438/30 |
| 2003/0157437 A1* | 8/2003 | Yamamoto et al. ........... 430/311 |
| 2004/0009678 A1* | 1/2004 | Asai et al. .................... 438/785 |
| 2004/0124537 A1* | 7/2004 | Takayama et al. ............ 257/758 |
| 2004/0227197 A1* | 11/2004 | Maekawa ..................... 257/410 |
| 2005/0074983 A1* | 4/2005 | Shinriki et al. ............... 438/785 |
| 2005/0093169 A1* | 5/2005 | Kajita .......................... 257/774 |
| 2005/0263719 A1* | 12/2005 | Ohdaira et al. ............ 250/492.1 |
| 2006/0003505 A1* | 1/2006 | Hwang et al. ................ 438/151 |
| 2006/0063392 A1* | 3/2006 | Ventzek et al. ............... 438/778 |
| 2006/0234517 A1* | 10/2006 | Yeo et al. ..................... 438/778 |
| 2007/0057234 A1* | 3/2007 | Teff et al. ..................... 252/397 |
| 2007/0077781 A1* | 4/2007 | Lee et al. ..................... 438/781 |
| 2007/0093078 A1* | 4/2007 | Harada et al. ................ 438/790 |
| 2007/0111521 A1* | 5/2007 | Wilk ............................. 438/680 |
| 2007/0207590 A1* | 9/2007 | Kiyotoshi et al. ............ 438/424 |
| 2007/0286998 A1* | 12/2007 | Hashimoto ................... 428/220 |
| 2008/0036038 A1* | 2/2008 | Hersee et al. ................. 257/615 |
| 2008/0260967 A1* | 10/2008 | Yoon et al. ................... 427/576 |
| 2009/0205857 A1* | 8/2009 | En et al. ....................... 174/258 |
| 2009/0232985 A1* | 9/2009 | Dussarrat et al. ........ 427/255.28 |
| 2010/0237043 A1* | 9/2010 | Garlough ........................ 216/34 |
| 2011/0201210 A1* | 8/2011 | Sato et al. .................... 438/770 |
| 2011/0244694 A1* | 10/2011 | Antonelli et al. ............ 438/763 |
| 2011/0262642 A1* | 10/2011 | Xiao et al. ............. 427/255.394 |

FOREIGN PATENT DOCUMENTS

| | | |
|---|---|---|
| JP | 2005-051192 A | 2/2005 |
| JP | 2005-336391 A | 12/2005 |
| JP | 2005-347472 A | 12/2005 |
| JP | 2006-253290 A | 9/2006 |
| JP | 2007-027792 A | 2/2007 |
| WO | 00/63956 | 10/2000 |

* cited by examiner (a)

(b)

METHOD FOR FORMING INTERLAYER DIELECTRIC FILM, INTERLAYER DIELECTRIC FILM, SEMICONDUCTOR DEVICE AND SEMICONDUCTOR MANUFACTURING APPARATUS

This application is; based upon and claims the benefit of priority from Japanese patent application No. 2007-240721, filed on Sep. 18, 2007, the disclosure of which is incorporated herein in its entirety by reference.

BACKGROUND OF THE INVENTION

1. Field of the Invention

The present invention relates to a method for forming an interlayer dielectric film, an interlayer dielectric film, a semiconductor device, and a semiconductor manufacturing apparatus; and particularly to a method for forming an interlayer dielectric film in which change over time is reduced, and an interlayer dielectric film formed by the method.

2. Description of the Related Art

Conventionally, silica ($SiO_2$) has been widely used as an interlayer dielectric material for use in the copper wiring layer of semiconductor devices. As semiconductor devices have become miniaturized and increased in speed, however, films with lower dielectric constants have increasingly been used as interlayer dielectric films, in order to reduce signal transmission delays in the wiring and the power consumption. Pores or hydrocarbons are typically introduced to reduce the dielectric constant, and methods such as a plasma CVD method and spin coating are used to produce interlayer dielectric films. Some interlayer dielectric films obtained using these methods are reported to have dielectric constants of 2.4 or less; however, due to reduced mechanical strength caused by an increase in pores or hydrocarbons, the interlayer dielectric films have the problem of lowered reliability due to removal during the semiconductor process.

For this reason, considering the mechanical strength, the plasma CVD method is often employed to form interlayer dielectric films. In most cases of growing interlayer dielectric films using the plasma CVD method, a carrier gas of an inert gas, as well as a mixed gas of a raw-material organic silane gas and an oxidizing gas are introduced into a reactor, and an oxidization reaction of the raw-material gas with the oxidizing gas is promoted in a plasma to grow an interlayer dielectric film.

An increase in pores or hydrocarbons causes not only lowered mechanical strength but also the adsorption of moisture in the atmosphere. The moisture adsorption in the pores raises a concern for an increase in the dielectric constant. In addition, the adsorbed moisture causes the decomposition of hydrocarbons, which is one cause of an increased dielectric constant. In particular, when a film is formed by the plasma CVD method, decomposition products of raw materials due to plasma reactions are not terminated, possibly resulting in sites where moisture is adsorbed. Interlayer dielectric films containing fluorine, in particular, have significantly increased dielectric constants due to moisture absorption. For this reason, Japanese Patent Laid-Open No. 11-330070 introduces an approach of introducing hydrogen during film formation to obtain a stable film, Japanese Patent Laid-Open No. 2006-253290, on the other hand, describes a method for removing reaction products by purging with an inert gas prior to film formation.

Using the technique described in Japanese Patent Laid-Open No. 11-330070, however, the formation of a film using a hydrogen reaction is difficult to control because the system is complicated due to the introduction of two types of gases, and the reduction of the film itself is induced. Moreover, even if purging with an inert gas is performed prior to film formation, as described in Japanese Patent Laid-Open No. 2006-253290, it is impossible to remove the reaction products formed during the subsequent formation of an interlayer dielectric film, consequently causing the dielectric constant of the film to change over time. Such a change over time in the dielectric constant of a film is apparent in the plasma polymerization method or plasma copolymerization method. The plasma polymerization method is a general term for one embodiment of the plasma CVD method, in which a mixed gas of an inert gas and a monomer with an unsaturated hydrocarbon is activated in a plasma without using an oxidizing gas, thereby growing an interlayer dielectric film having the monomer as a portion of its skeleton. The plasma copolymerization method is a method in which an interlayer dielectric film is grown using a plurality of raw-material monomers and an inert gas without the addition of an oxidizing gas. To form interlayer dielectric films using these plasma reactions, a method is required that is simple and reduces change over time in the dielectric constant. The present invention has been made in view of the above-described circumstances, and aims to provide an interlayer dielectric film in which change over time is reduced and which is stable for a long period, a semiconductor device using the interlayer dielectric film, and a method for manufacturing the semiconductor device.

SUMMARY OF THE INVENTION

An exemplary object of the invention is to provide an interlayer dielectric film in which change over time is reduced and which is stable for a long period, a semiconductor device using the interlayer dielectric film, and a method for manufacturing the semiconductor device.

A method according to an exemplary aspect of the invention includes a method for forming an interlayer dielectric film by a plasma CVD method using a monomer with an unsaturated hydrocarbon comprises purging with an inert gas immediately after turning off a radio frequency power for film formation. Alternatively, a method according to an exemplary aspect of the invention includes a method for forming an interlayer dielectric film by a plasma CVD method using a monomer with an unsaturated hydrocarbon comprises forming a film, applying a surface treatment using a plasma of an inert gas, and then purging with an inert gas. Still alternatively, a method according to an exemplary aspect of the invention includes a method for forming an interlayer dielectric film by a plasma CVD method using a monomer with an unsaturated hydrocarbon comprises stopping a supply of a raw material, applying a plasma treatment using only a carrier gas, then turning off a radio frequency power during film formation, and purging with an inert gas.

DETAILED DESCRIPTION OF THE EXEMPLARY EMBODIMENTS

First Exemplary Embodiment

The best mode for carrying out the invention is next described using the drawings.

A monomer with an unsaturated hydrocarbon is used as a raw material to form an interlayer dielectric film. Examples of monomers with an unsaturated hydrocarbon include monomers with a 3-membered ring of SiO (Formula 1), monomers with a 4-membered ring of SiO (Formula 5), and monomers with a straight-chain structure (Formula 10):

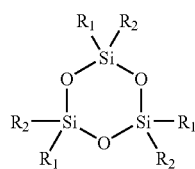

[Formula 1]

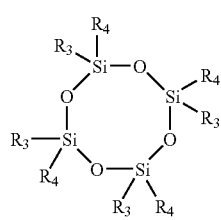

[Formula 5]

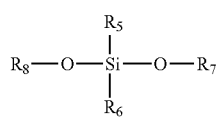

[Formula 10]

In the monomers with an unsaturated hydrocarbon with the above-described 3-membered ring represented by Formula 1, R1 is an unsaturated carbon compound; R2 is a saturated carbon compound; R1 is a vinyl group or an allyl group; and R2 is any of a methyl, an ethyl group, a propyl group, an isopropyl group, and a butyl group.

In the monomers with an unsaturated hydrocarbon with the above-described 4-membered ring represented by Formula 5, R3 is an unsaturated carbon compound; R4 is a saturated carbon compound; R1 is a vinyl group or an allyl group; and R2 is any of a methyl group, an ethyl group, a propyl group, an isopropyl group, and a butyl group.

In the straight-chain monomers represented by Formula 10, R5 is an unsaturated carbon compound; R6, R7, and R8 are each a saturated carbon compound; R5 is a vinyl group or an allyl group; and R6, R7, and R8 are each any of a methyl group, an ethyl group, a propyl group, an isopropyl group, and a butyl group.

Figure 1:
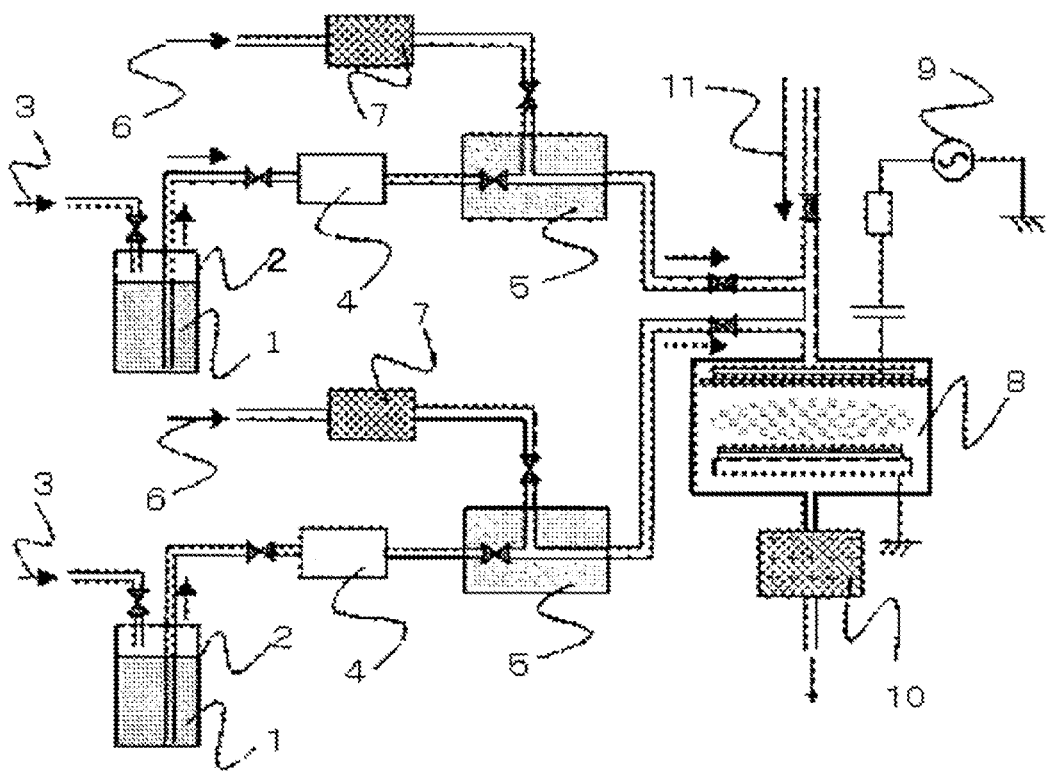
FIG. 1 is a schematic diagram of an apparatus for forming films for semiconductor devices according to a first exemplary embodiment of the invention.

FIG. 1 shows a plasma CVD apparatus used in forming films.

A monomer reservoir 2 is a raw-material supply. A pressure-fed gas 3 is a gas for discharging a raw-material monomer from the monomer reservoir 2. A liquid mass flow 4 is a device for controlling the flow rate of a raw-material monomer 1 discharged from the monomer reservoir 2. A vaporizer 5 is a device for vaporizing the raw-material monomer 1. A carrier gas 6 is a gas for transporting the vaporized raw-material monomer. A mass flow 7 is a device for controlling the flow rate of the carrier gas 6. A reactor 8 is a chamber for forming films by plasma CVD. An RF unit 9 is a device for applying RF to generate a plasma. An exhaust pump 10 is a device for discharging the vaporized gas of the raw-material monomer 1 and the carrier gas 6 introduced into the reactor 8. An inert gas 11 is a purge gas.

Figure 2:
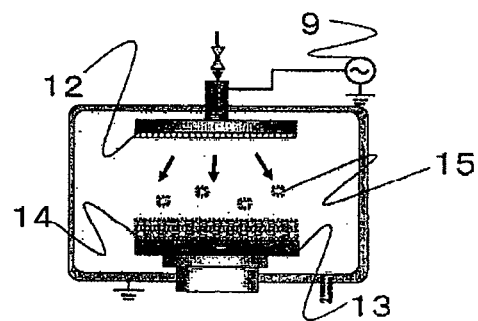
FIG. 2 is a schematic diagram of the chamber of the apparatus for forming films for semiconductor devices according to the first exemplary embodiment of the invention.
Figure 2:
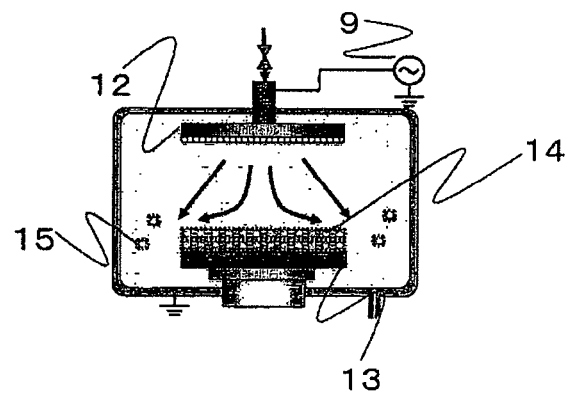

FIG. 2 is a diagram showing the reactor 8 in greater detail.

A bias is applied from the RF unit 9 to an upper electrode 12 and a lower electrode 13, where a plasma is thereby generated. A substrate 14 is a wafer on which a film is formed. Decomposition products 15 are produced by plasma decomposition of the raw-material monomer 1. The film is formed by the method described below. The raw-material monomer 1 charged in the monomer reservoir 2 is discharged therefrom via the pressure-fed gas 3, and the liquid mass flow 4 controls the flow rate of the raw-material monomer 1. The flow rate-controlled raw-material monomer 1 receives heat from a heater (not shown) in the vaporizer 5 and is thereby vaporized. The vaporized gas is mixed in the vaporizer 5 with the carrier gas 6 whose flow rate is controlled by the mass flow 7, and the mixture is fed to the reactor 8. The vaporized gas of the raw-material monomer 1 and the carrier gas 6 fed to the reactor 8 produce a plasma between the upper electrode 12 and the lower electrode 13, using the electrical power supplied from the RF unit 9. At the time, an interlayer dielectric film is formed on the substrate 14 by the CVD reaction. When the radio frequency is to be turned off, the decomposition products 15 of the raw-material monomer 1 are present between the upper electrode 12 and the lower electrode 13.

During the film formation, only the raw-material monomer and carrier gas, or the raw-material monomer, carrier gas, and inert gas are introduced into the reactor 8. Therefore, the oxygen dangling bonds of these decomposition products have nothing to be terminated with, thus easily adsorbing moisture and the like when exposed in the atmosphere. It is thus necessary to shorten the length of time that the decomposition products reside, and discharge them out of the reactor before moisture adsorption.

Example 1

Example 1 using the first exemplary embodiment is next described using the drawings. Examples of raw-material monomers that can be used to form an interlayer dielectric film include the following shown below. Monomers with a 3-membered ring of SiO represented by (Formula 2) to (Formula 4) can be used as monomers:

[Formula 2]
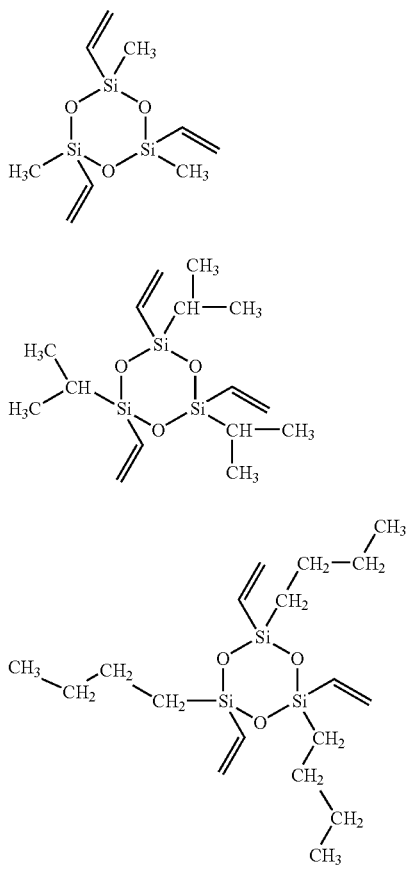

[Formula 3]

[Formula 4]

Monomers with a 4-membered ring of SiO represented by (Formula 6) to (Formula 9) can be used as raw materials:

[Formula 6]
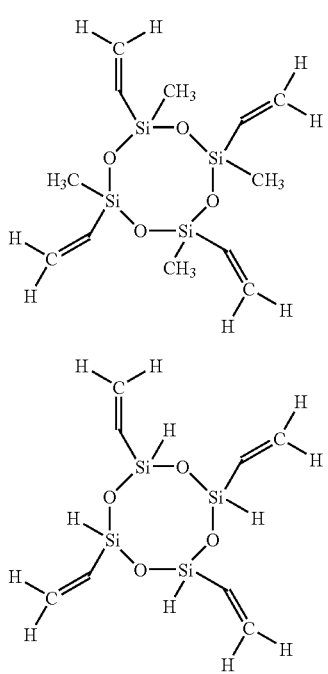

[Formula 7]

[Formula 8]
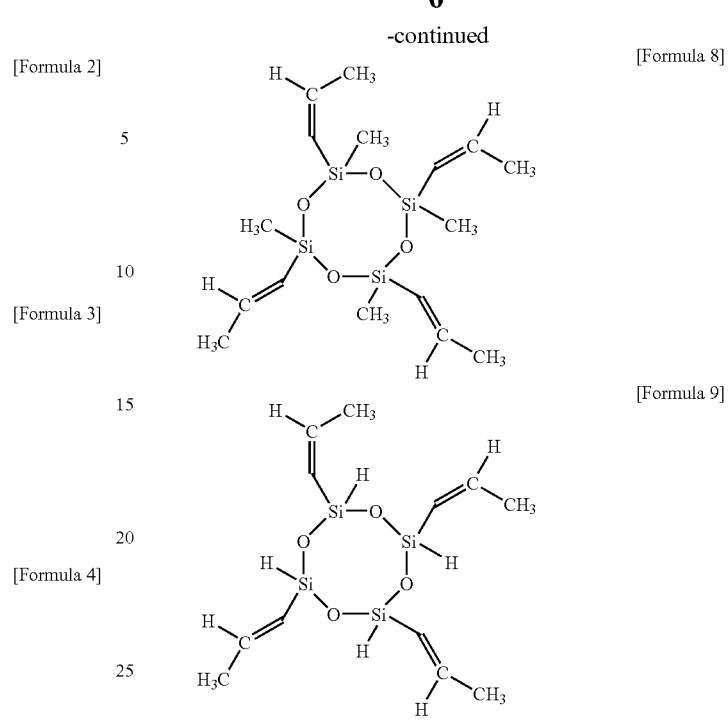

[Formula 9]

Straight-chain monomers with a structure represented by (Formula 11) can be used as raw materials:

[Formula 11]

Figure 6:
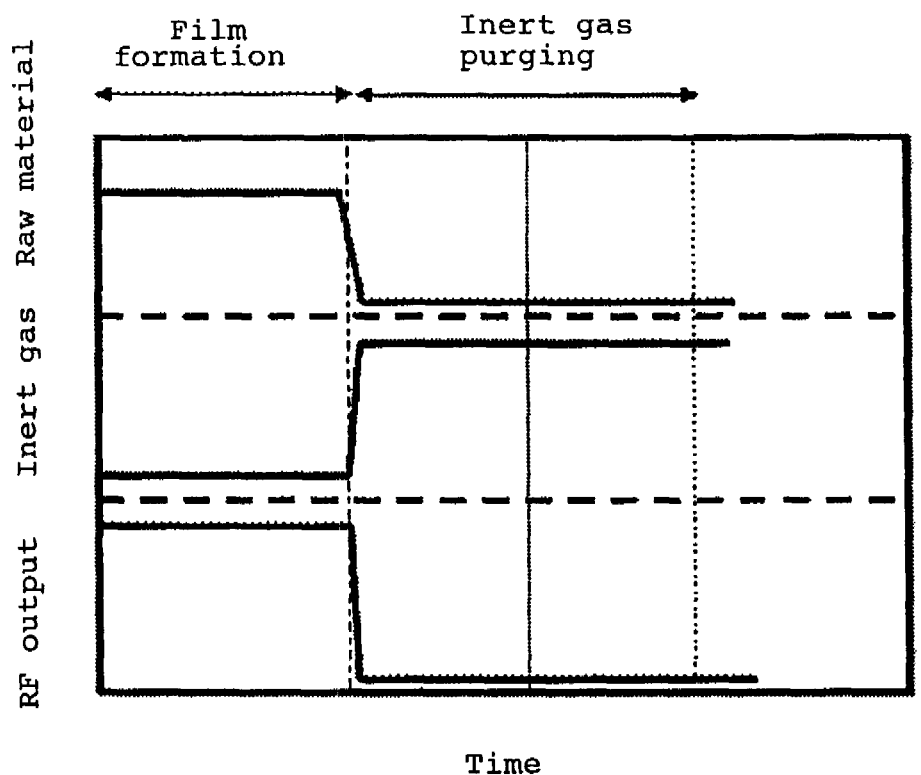
FIG. 6 is a diagram showing the process of forming a film according to the first exemplary embodiment of the invention.

The above-described raw-material monomer 1 charged in the monomer reservoir 2 is discharged therefrom via the pressure-fed gas 3, and the liquid mass flow 4 controls the flow rate of the raw-material monomer 1. The flow rate-controlled raw-material monomer 1 receives heat from a heater (not shown) in the vaporizer 5 and is thereby vaporized. The vaporized gas is mixed in the vaporizer 5 with the carrier gas 6 whose flow rate is controlled by the mass flow 7, and the mixture is fed to the reactor 8. The vaporized gas of the raw-material monomer 1 and the carrier gas 6 fed to the reactor 8 produce a plasma between the upper electrode 12 and the lower electrode 13, using the electrical power supplied from the RF unit 9. The film-formation apparatus shown in FIG. 1 includes two systems of raw-material supply lines, making it possible to form a film either by plasma polymerization using only a single raw material or by plasma copolymerization reaction using two raw materials. Using either of these techniques, an interlayer dielectric film is formed on the substrate 14. When the radio frequency is to be turned off, the decomposition products 15 of the raw-material monomer 1 are present between the upper electrode 12 and the lower electrode 13. FIG. 6 shows the process of forming a film according to the first exemplary embodiment. When the radio frequency power is turned off, the supply of the raw-material monomer is simultaneously stopped. The term "simultaneously" here means that the timing at which the radio frequency power is turned off is the same as the timing at which the raw-material supply valve (not shown) is closed, but there is a time lag of several seconds in the state of the reactor. In order to discharge the decomposition products 15 from the reactor to prevent them from being adsorbed onto the substrate 14, the inert gas 11 is introduced to purge the reactor 8. The average residence time τ in which gaseous molecules (decomposition products) then reside in the reactor 8 can be determined according to the equation shown below. Equation 12 is described on page 16 of "*Purazuma Purosesshingu-no Kiso* (Basics of Plasma Processing)" by Yukio Okamoto, published by Denkishoin Co., Ltd.

$$\tau = pV/pS \quad \text{(Equation 12)}$$

wherein τ is an average residence time (sec), p is a reactor pressure (Torr), V is a reactor volume (L), and S is an exhaust rate (L/sec). Although the exhaust rate S cannot be derived directly, the exhaust amount Q can be expressed as the product of p and S; hence, (Equation 12) can be modified as follows:

$$\tau = pV/Q \quad \text{(Equation 13)}$$

Figure 3:
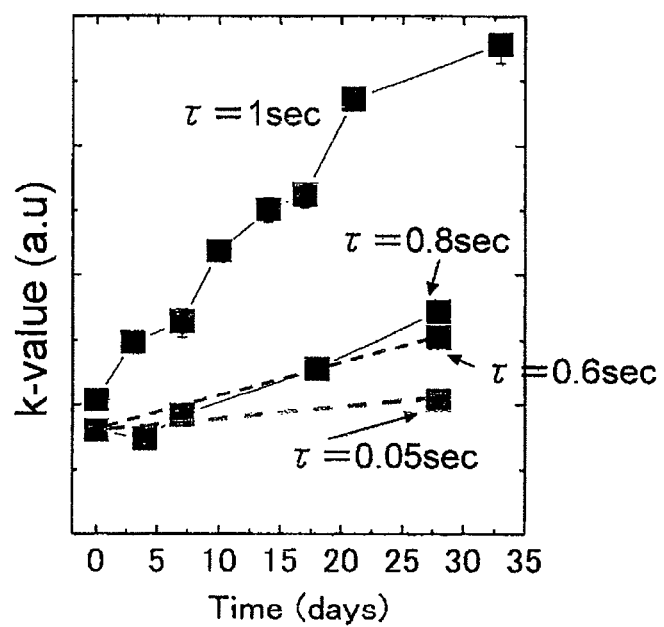
FIG. 3 shows the relationships between the residence times and changes over time in dielectric constant.

When the reactor is purged based on Equation 13, the exhaust amount Q is equal to the amount of the purge gas introduced if the reactor pressure is constant. Therefore, the average residence time τ can be shortened by increasing the amount of the purge gas introduced, thus enabling the decomposition products 15 to be discharged before being adsorbed onto the substrate. A mixed gas of helium and nitrogen was used as an inert gas. FIG. 3 is a diagram showing changes over time in the dielectric constants of interlayer dielectric films. This figure reveals that the reference for which purging was performed to lengthen the average residence time τ shows an abrupt increase in its dielectric constant.

Figure 4:
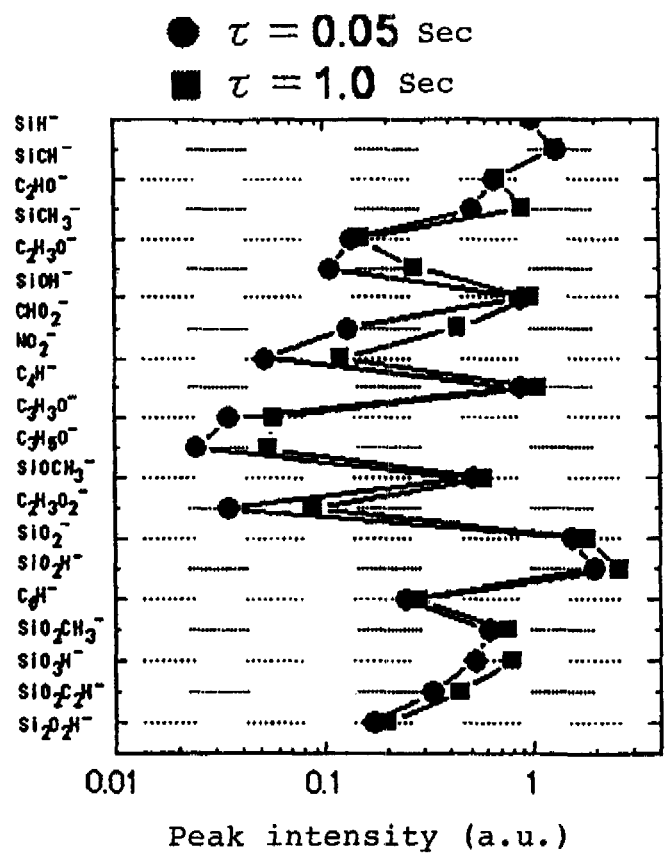
FIG. 4 shows the relationships between the residence times and the presence of deposited matter on the outermost surfaces in the invention.
Figure 5:
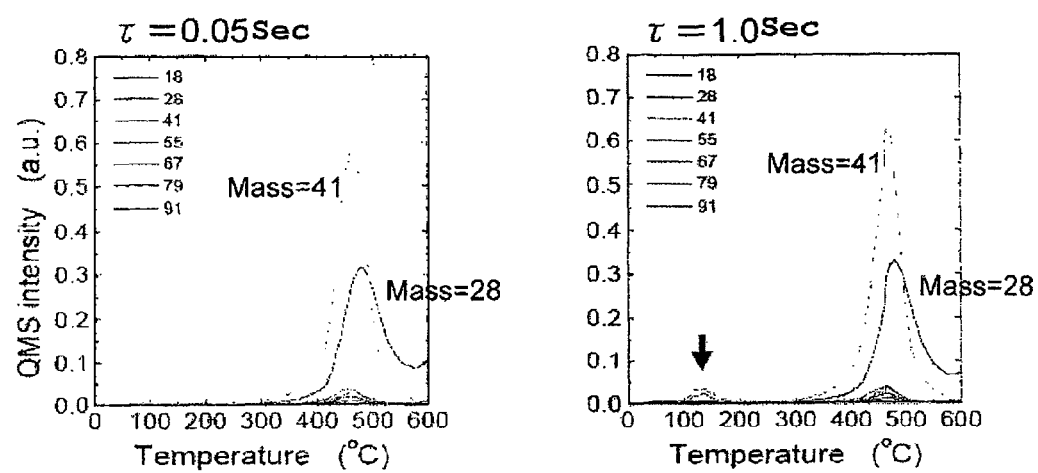
FIG. 5 shows a diagram showing the residence times and the results of TDS analyses in the invention.

Thus, an analysis was performed by TOF-SIMS on the outermost surface layers of samples for which the residence time τ is 1 second and the residence time is 0.05 seconds, to analyze the difference in their surface condition. The results are shown in FIG. 4. This figure reveals that the surface of the film for which purging was performed at a longer residence time contained many oxygen-containing substances such as carboxylic acids. These carboxylic acids are attributed to decomposition products adsorbed on the surface of the substrate.

A TDS analysis was next performed to analyze the organic matter emitted from the surface. The results showed that, in the case of the sample for which purging was performed at a shorter residence time, organic matter was not emitted unless the sample was heated to 400° C. or higher. In contrast, in the case of the sample for which purging was performed at a longer residence time, it was found that organic matter was emitted near 120° C. This can be attributed to the fact that moisture and the like were adsorbed by the decomposition products adsorbed on the surface, causing decomposition of hydrocarbons, thus easily resulting in the emission of organic matter at low temperature.

Second Exemplary Embodiment

A second exemplary embodiment for carrying out the invention is next described using the drawings.

Figure 7:
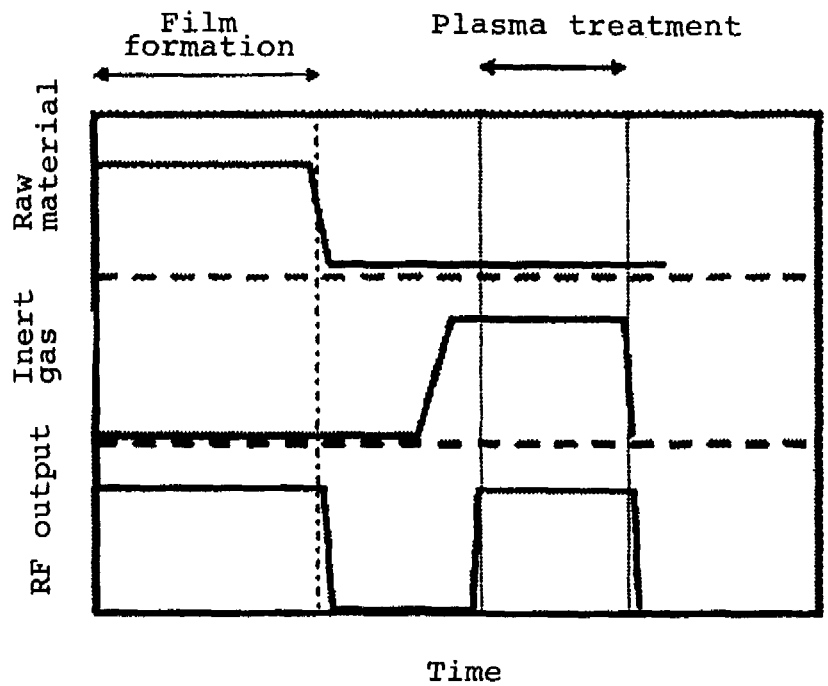
FIG. 7 is a diagram showing the process of forming a film according to the second exemplary embodiment of the invention.

Subsequent to forming an interlayer dielectric film on a substrate 14 as in the first embodiment, an inert gas was introduced to plasma-treat the surface of the interlayer dielectric film. This process is illustrated in FIG. 7. After forming the film, the introduction of the raw-material monomer and that of the carrier gas were stopped simultaneously, and then an inert gas was introduced. After stabilization, a plasma was generated to perform a treatment. He was used as the inert gas, and the treatment was performed in the reactor at a pressure of 800 Pa and an RF power of 400 W for 10 to 60 seconds. The treatment conditions vary depending on the size of the reactor, the type of the inert gas, and the type of the raw-material monomer, and cannot therefore be determined unequivocally. After the plasma treatment using the inert gas, purging was performed under conditions such that the residence time of gaseous molecules was 0.8 seconds. As a result, change over time in the dielectric constant of the interlayer dielectric film could be reduced, as in the case of the shortened residence time of the purge gas in the first embodiment.

The monomer with an unsaturated hydrocarbon used in the second exemplary embodiment can have a 3-membered ring of SiO, a 4-membered ring of SiO, or a straight chain structure of SiO, including the compounds of Formula 1 to Formula 11 described in the first exemplary embodiment.

According to TDS analysis, organic matter is not emitted near 120° C. as in the case of the shorter residence time of the purge gas in the first exemplary embodiment.

Third Exemplary Embodiment

A third exemplary embodiment for carrying out the invention is next described using the drawings.

Figure 8:
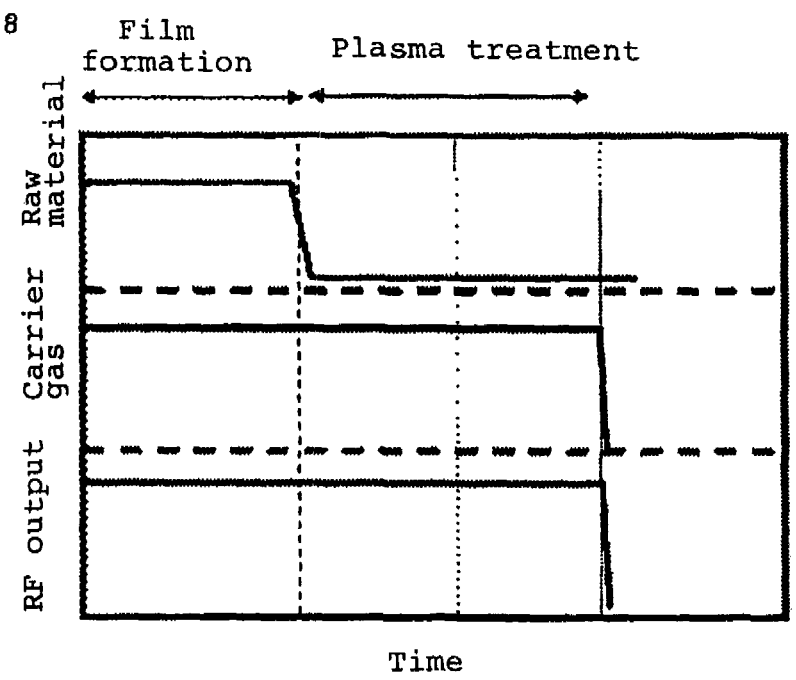
FIG. 8 is a diagram showing the process of forming a film according to the third exemplary embodiment of the invention.

An interlayer dielectric film is formed on a substrate 14 as in the first embodiment, and the supply of the raw-material monomer is stopped prior to stopping the application of the RF power. This process is illustrated in FIG. 8. This causes a plasma to be generated in the reactor using only a carrier gas. He was used as the carrier gas to treat the surface of the interlayer dielectric film. The surface treatment was performed for 10 to 60 seconds under the same conditions as in forming the film except that the introduction of the raw material was stopped. Subsequent to the plasma treatment using the carrier gas, purging was performed under conditions such that the residence time of gaseous molecules was 0.6 seconds. As a result, change over time in the dielectric constant of the interlayer dielectric film could be reduced, as in the case of the shorter residence time of the purge gas in the first exemplary embodiment.

According to TDS analysis, organic matter is not emitted near 120° C. as in the case of the shorter residence time of the purge gas in the first exemplary embodiment.

The carrier gas can comprise at least any one of helium, nitrogen, and argon.

The monomer with an unsaturated hydrocarbon used in the third exemplary embodiment can have a 3-membered ring of SiO, a 4-membered ring of SiO, or a straight chain structure of SiO, including the compounds of Formula 1 to Formula 11 described in the first exemplary embodiment.

In the method of the above three exemplary embodiments, only a raw-material monomer and a carrier gas or only a raw-material monomer, a carrier gas, and an inert gas can be introduced into a reactor during the film formation. And also, the inert gas can comprise at least one of helium, nitrogen, and argon. And also, the flow rate of the inert gas during purging can be controlled so that a residence time thereof is 0.8 seconds or less in a film-formation chamber. And also, the inert gas can be supplied via a different route from a raw-material supply line. Furthermore, these methods can use a plasma polymerization reaction using a single monomer with an unsaturated hydrocarbon as a raw material, or a plasma polymerization reaction using two monomers with an unsaturated hydrocarbon as raw materials.

A fourth exemplary embodiment of the invention is an interlayer dielectric film formed by the above-described method for forming an interlayer dielectric film, which is free of organic matter emitted at 120° C. according to a TDS analysis.

A fifth exemplary embodiment of the invention is a semiconductor device comprising an interlayer dielectric film formed by the above-described method for forming an interlayer dielectric film.

Furthermore, a sixth exemplary embodiment of the invention is a semiconductor manufacturing apparatus for forming an interlayer dielectric film by the above-described method for forming an interlayer dielectric film.

An exemplary advantage according to the invention is to prevent the long-term reliability of the wiring from deteriorating, thereby enabling the making of high-speed, low-power-consumption LSIs, using the method for manufacturing an interlayer dielectric film, the interlayer dielectric film, the semiconductor device, and the semiconductor manufacturing apparatus of the present invention.

Furthermore, an exemplary advantage according to the invention is to prevent monomer decomposition products that could not contribute to the film formation from being adsorbed onto the surface of the interlayer dielectric film in the chamber after the film formation. The monomer decomposition products are not terminated with their bonds cut, and are therefore highly active and likely to adsorb moisture and the like in the atmosphere. Therefore, if these monomer decomposition products are adsorbed onto the surface of the dielectric material, the adsorption of moisture starts from these areas, causing the moisture to reside in the pores, or causing decomposition of the hydrocarbon component. As a result, the dielectric constant of the interlayer dielectric film increases with the passage of time. This phenomenon is likely to occur in the process of introducing only a raw-material monomer and a carrier gas, or only a raw material monomer, a carrier gas, and an inert gas into a reactor during film formation. This is because the decomposed monomer contains many dangling bonds of oxygen, and is more likely to adsorb moisture and the like in the atmosphere.

The present invention has been made in view of these phenomena, and is particularly directed to a method for preventing monomer decomposition products from being adsorbed onto the surface of an interlayer dielectric film formed of a monomer with an unsaturated hydrocarbon. When turning off the radio frequency power, monomer decomposition products, which have not contributed to the film formation, are present in the film-formation chamber. By rapidly discharging these decomposition products out of the chamber using an inert gas, it is possible to prevent the decomposition products from being adsorbed onto the surface of the interlayer dielectric film. Moreover, any adsorbed decomposition products can be removed by applying a surface treatment using a plasma of an inert gas subsequent to the film formation. In addition, any adsorbed decomposition products can be removed by first stopping the supply of the raw-material monomer during the film formation, and then applying a surface treatment using a plasma of only a carrier gas.

While the invention has been particularly shown and described with reference to exemplar embodiments thereof, the invention is not limited to these embodiments. It will be understood by those of ordinary skill in the art that various changes in form and details may be made therein without departing from the spirit and scope of the present invention as defined by the claims.

What is claimed is:

1. A method for forming an interlayer dielectric film by a plasma CVD method using a raw-material monomer with an unsaturated hydrocarbon, comprising:

forming the interlayer dielectric film in a film-forming chamber by the plasma CVD method using the raw-material monomer with the unsaturated hydrocarbon;

after the operation of forming the interlayer dielectric film, applying a surface treatment using a plasma of a first inert gas to a surface of the interlayer dielectric film in the film-forming chamber;

and then turning off a radio frequency power used for generation of the plasma of the first inert gas and purging the film-forming chamber with a second inert gas, wherein during the operation of forming the interlayer dielectric film, a carrier gas is used to feed the raw-material monomer to the film-forming chamber, wherein after the operation of forming the interlayer dielectric film, the surface treatment using the plasma of the first inert gas is subsequently applied in the film-forming chamber, wherein only the raw-material monomer and a carrier gas are introduced into the film-forming chamber during the operation of forming the interlayer dielectric film, and the raw-material monomer and the carrier gas are introduced into the film-forming chamber via a raw-material supply valve, wherein after forming the film, the introduction of the raw-material monomer and the carrier gas are stopped simultaneously, wherein the flow rate of the second inert gas during the purging is controlled so that a residence time thereof is 0.8 seconds or less in the film-forming chamber, wherein the raw-material monomer with the unsaturated hydrocarbon is selected from the group consisting of an organosiloxane having a 3-membered ring of SiO of Formula I, an organosiloxane having a 4-membered ring of SiO of Formula V, and an organosiloxane having a straight chain structure of SiO of Formula X:

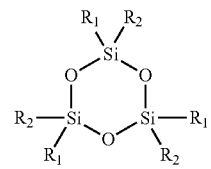

[Formula I]

wherein R1 is an unsaturated hydrocarbon; R2 is a saturated hydrocarbon or hydrogen;

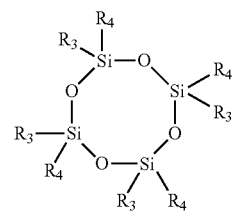

[Formula V]

wherein R3 is an unsaturated hydrocarbon; R4 is a saturated hydrocarbon;

[Formula X]

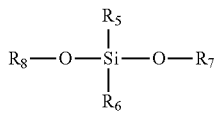

wherein R5 is an unsaturated hydrocarbon; R6, R7, and R8 are each a saturated hydrocarbon.

2. The method for forming the interlayer dielectric film according to claim 1,
wherein the second inert gas is selected from the group consisting of helium, nitrogen, and argon.

3. The method for forming the interlayer dielectric film according to claim 1,
wherein the raw-material monomer with the unsaturated hydrocarbon is selected from the group consisting of an organosiloxane having a 3-membered ring of SiO of Formula 1:

[Formula 1]

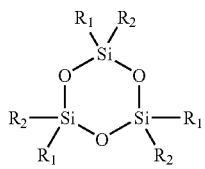

wherein R1 is a vinyl group or an allyl group; and R2 is selected from the group consisting of a methyl group, an ethyl group, a propyl group, an isopropyl group, and a butyl group.

4. The method for forming the interlayer dielectric film according to claim 1,
wherein the raw-material monomer with the unsaturated hydrocarbon is selected from the group consisting of an organosiloxane having a 3-membered ring of SiO of Formula 2, Formula 3 and Formula 4:

[Formula 2]

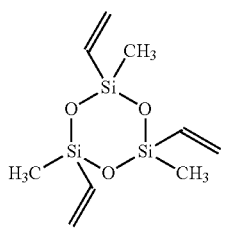

[Formula 3]

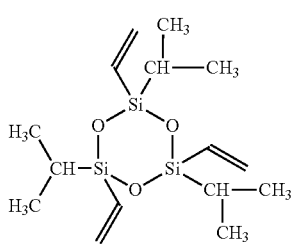

[Formula 4]

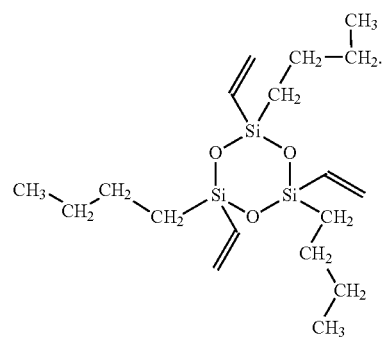

5. The method for forming the interlayer dielectric film according to claim 1,
wherein the raw-material monomer with the unsaturated hydrocarbon is selected from the group consisting of an organosiloxane having a 4-membered ring of SiO of Formula 5:

[Formula 5]

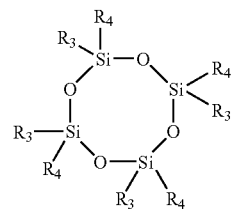

wherein R3 is a vinyl group or an allyl group; and R4 is selected from the group consisting of a methyl group, an ethyl group, a propyl group, an isopropyl group, and a butyl group.

6. The method for forming the interlayer dielectric film according to claim 1,
wherein the raw-material monomer with the unsaturated hydrocarbon is selected from the group consisting of an organosiloxane having a 4-membered ring of SiO of Formula 6, Formula 7, Formula 8 and Formula 9:

[Formula 6]

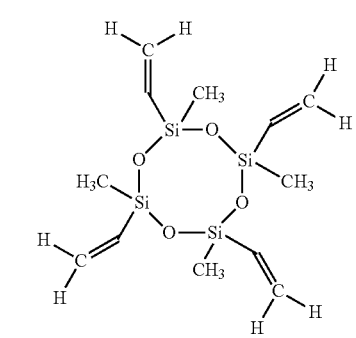

[Formula 7]

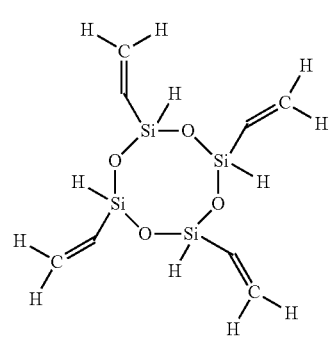

-continued

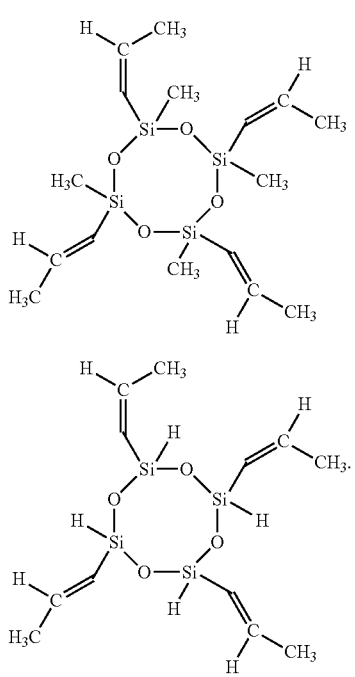

[Formula 8]

[Formula 9]

7. The method for forming the interlayer dielectric film according to claim 1,
wherein the raw-material monomer with the unsaturated hydrocarbon is selected from the group consisting of an organosiloxane having a straight chain structure of SiO of Formula 10:

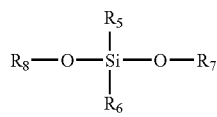

[Formula 10]

wherein R5 is a vinyl group or an allyl group; and R6, R7, and R8 are selected from the group consisting of a methyl group, an ethyl group, a propyl group, an isopropyl group and a butyl group.

8. The method for forming the interlayer dielectric film according to claim 1,
wherein the raw-material monomer with the unsaturated hydrocarbon is an organosiloxane having a straight chain structure of SiO of Formula 11:

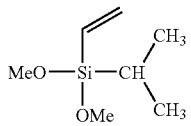

[Formula 11]

9. The method for forming the interlayer dielectric film according to claim 1,
wherein the first inert gas and the second inert gas is supplied via a different route from a raw-material supply line.

10. The method for forming the interlayer dielectric film according to claim 1,
which uses a plasma polymerization reaction using a single raw-material monomer with an unsaturated hydrocarbon as a raw material, or a plasma polymerization reaction using two raw-material monomers with an unsaturated hydrocarbon as raw materials.

11. An interlayer dielectric film formed by the method of claim 1, which is free of organic matter released at 120° C. according to a Thermal Desorption Spectroscopy TDS analysis.

12. A semiconductor device comprising an interlayer dielectric film, wherein the interlayer dielectric film is the dielectric film of claim 11.

13. The method of the interlayer dielectric film according to claim 1,
wherein after the raw-material monomer and the carrier gas are stopped,
the surface treatment is applied using the plasma of the first inert gas.

* * * * *